US012575255B2

(12) United States Patent
Jiao et al.

(10) Patent No.: US 12,575,255 B2
(45) Date of Patent: Mar. 10, 2026

(54) OLED DEVICE AND PREPARATION METHOD THEREFOR, DISPLAY SUBSTRATE, AND DISPLAY APPARATUS

(71) Applicant: BOE Technology Group Co., Ltd., Beijing (CN)

(72) Inventors: Zhiqiang Jiao, Beijing (CN); Lilei Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 926 days.

(21) Appl. No.: 17/789,520

(22) PCT Filed: Aug. 5, 2021

(86) PCT No.: PCT/CN2021/110763
§ 371 (c)(1),
(2) Date: Jun. 28, 2022

(87) PCT Pub. No.: WO2022/062705
PCT Pub. Date: Mar. 31, 2022

(65) Prior Publication Data
US 2023/0030418 A1 Feb. 2, 2023

(30) Foreign Application Priority Data
Sep. 28, 2020 (CN) .......................... 202011045684.9

(51) Int. Cl.
*H10K 50/16* (2023.01)
*H10K 50/11* (2023.01)
(Continued)

(52) U.S. Cl.
CPC ........... *H10K 50/167* (2023.02); *H10K 50/11* (2023.02); *H10K 50/13* (2023.02); *H10K 50/15* (2023.02);
(Continued)

(58) Field of Classification Search
CPC .......................... H10K 50/167; H10K 2101/30
See application file for complete search history.

(56) References Cited

U.S. PATENT DOCUMENTS

| | | | | |
|---|---|---|---|---|
| 8,686,403 B2 * | 4/2014 | Kang | ................... | H10K 50/165 257/E51.019 |
| 10,069,096 B1 | 9/2018 | Xu | | |

(Continued)

FOREIGN PATENT DOCUMENTS

| | | |
|---|---|---|
| CN | 101297018 A | 10/2008 |
| CN | 101371619 A | 2/2009 |

(Continued)

OTHER PUBLICATIONS

Office Action dated Feb. 14, 2024 for U.S. Appl. No. 17/422,729.
(Continued)

*Primary Examiner* — Vu A Nguyen
(74) *Attorney, Agent, or Firm* — Ling Wu; Stephen Yang; Ling and Yang Intellectual Property

(57) ABSTRACT

An OLED device, including: an anode (100), a cathode (300), and a first light-emitting unit (200) located between the anode (100) and the cathode (300). The first light-emitting unit (200) comprises a hole functional unit (210) and a light-emitting layer (220) that are sequentially stacked. The hole functional unit (210) is located between the anode (100) and the light-emitting layer (220). The hole functional unit (210) comprises a first functional layer (211) for transporting electrons, a second functional layer (212) for injecting holes, and a third functional layer (213) for transporting holes, which are sequentially stacked. The first functional layer (211) comprises an electron transport material on which one or more among an active metal and an active metal compound is doped.

18 Claims, 7 Drawing Sheets

(51) Int. Cl.

| | |
|---|---|
| *H10K 50/13* | (2023.01) |
| *H10K 50/15* | (2023.01) |
| *H10K 50/165* | (2023.01) |
| *H10K 50/17* | (2023.01) |
| *H10K 59/80* | (2023.01) |
| *H10K 101/30* | (2023.01) |
| *H10K 101/40* | (2023.01) |
| *H10K 102/00* | (2023.01) |

(52) U.S. Cl.
CPC .......... *H10K 50/16* (2023.02); *H10K 50/165* (2023.02); *H10K 50/17* (2023.02); *H10K 50/171* (2023.02); *H10K 59/8051* (2023.02); *H10K 59/80518* (2023.02); *H10K 2101/30* (2023.02); *H10K 2101/40* (2023.02); *H10K 2102/351* (2023.02)

(56) References Cited

U.S. PATENT DOCUMENTS

| | | | |
|---|---|---|---|
| 10,516,129 | B2 | 12/2019 | Liao et al. |
| 2004/0209119 | A1 | 10/2004 | Seo et al. |
| 2007/0102698 | A1 | 5/2007 | Kang et al. |
| 2007/0285010 | A1 | 12/2007 | Lee et al. |
| 2009/0009101 | A1 | 1/2009 | Kang et al. |
| 2009/0212689 | A1 | 8/2009 | Lee et al. |
| 2011/0079774 | A1 | 4/2011 | Kang et al. |
| 2011/0240967 | A1 | 10/2011 | Lee et al. |
| 2015/0014645 | A1 | 1/2015 | Park et al. |
| 2015/0144895 | A1 | 5/2015 | Joo et al. |
| 2015/0311463 | A1 | 10/2015 | Park et al. |
| 2015/0357593 | A1* | 12/2015 | Gunji .................. H10K 50/167 257/40 |
| 2016/0155950 | A1 | 6/2016 | Kim et al. |
| 2016/0293879 | A1 | 10/2016 | Chen et al. |
| 2017/0090244 | A1 | 3/2017 | Jiang et al. |
| 2017/0125695 | A1 | 5/2017 | Pentlehner et al. |
| 2017/0187005 | A1 | 6/2017 | Li et al. |
| 2018/0033990 | A1 | 2/2018 | Kim |
| 2018/0033995 | A1 | 2/2018 | Kim et al. |
| 2019/0081120 | A1 | 3/2019 | Zhang et al. |
| 2019/0372048 | A1 | 12/2019 | Cheng et al. |
| 2020/0329218 | A1 | 10/2020 | Ghaemi et al. |
| 2021/0043865 | A1 | 2/2021 | Bai |
| 2021/0122723 | A1 | 4/2021 | Zhang et al. |
| 2021/0202844 | A1 | 7/2021 | Hur et al. |
| 2022/0344607 | A1 | 10/2022 | Tong et al. |

FOREIGN PATENT DOCUMENTS

| | | |
|---|---|---|
| CN | 102214794 A | 10/2011 |
| CN | 104218165 A | 12/2014 |
| CN | 104335378 A | 2/2015 |
| CN | 104882555 A | 9/2015 |
| CN | 105093667 A | 11/2015 |
| CN | 105140258 A | 12/2015 |
| CN | 105390529 A | 3/2016 |
| CN | 110571346 A | 12/2019 |
| CN | 111668379 A | 9/2020 |
| CN | 112164753 A | 1/2021 |
| EP | 2752903 A1 | 7/2014 |
| EP | 3276698 A1 | 1/2018 |
| JP | 2010-165510 A | 7/2010 |
| KR | 10-2018-0013604 A | 2/2018 |

OTHER PUBLICATIONS

Office Action dated Feb. 24, 2025 for U.S. Appl. No. 17/422,729.
Office Action dated Oct. 18, 2024 for U.S. Appl. No. 17/422,729.
Office Action dated Oct. 25, 2023 for U.S. Appl. No. 17/422,729.
International Search Report for PCT/CN2020/131515 Mailed Jul. 7, 2021.
International Search Report for PCT/CN2021/110763 Mailed Oct. 15, 2021.
Office Action dated Apr. 26, 2021 for Chinese Patent Application No. 202011045684.9 and English Translation.
Decision to Grant dated Oct. 13, 2021 for Chinese Patent Application No. 202011045684.9 and English Translation.
Office Action dated Jun. 18, 2024 for U.S. Appl. No. 17/422,729.

\* cited by examiner

OLED DEVICE AND PREPARATION METHOD THEREFOR, DISPLAY SUBSTRATE, AND DISPLAY APPARATUS

CROSS-REFERENCE TO RELATED APPLICATION

This application is a national stage application of PCT Application No. PCT/CN2021/110763, which is filed on Aug. 5, 2021 and claims priority to Chinese Patent Application No. 202011045684.9, entitled "OLED Device and Preparation Method therefor, Display Substrate, and Display Apparatus" filed on Sep. 28, 2020, in the China National Intellectual Property Administration, the content of which should be regarded as being incorporated herein by reference.

TECHNICAL FIELD

The present disclosure relates to, but is not limited to, the field of display technology, in particular to an Organic Light Emitting Diode (OLED) device, a manufacturing method thereof, a display substrate and a display apparatus.

BACKGROUND

OLED display apparatuses have the advantages such as ultra-thinness, large viewing angle, active light emission, high brightness, continuous and adjustable color of emitted light, low cost, fast response, low power consumption, wide operating temperature range and flexible display, and have gradually become a promising next generation display technology. In recent years, a great deal of research and development work has provided a solid foundation for the large-scale application of OLED devices. At present, relevant OLED display and lighting products are already commercially available. However, although the manufacturing technology of OLED devices is already established, the performance of the devices is still the key problem that restricts its large-scale application.

SUMMARY

The following is a summary of subject matters described herein in detail. The summary is not intended to limit the protection scope of claims.

Embodiments of the present disclosure provide an OLED device, a manufacturing method thereof, a display substrate, and a display apparatus.

In one aspect, an OLED device is provided in an embodiment of the present disclosure, which includes an anode, a cathode, and a first light-emitting unit located between the anode and the cathode. The first light-emitting unit includes a light-emitting layer and a hole functional unit located between the anode and the light-emitting layer. The hole functional unit includes at least a first functional layer for transporting electrons and at least one hole transport layer located between the first functional layer and the light-emitting layer. The first functional layer is in contact with the anode. Any hole transport layer includes at least a second functional layer for injecting holes and a third functional layer for transporting holes. The first functional layer includes an electron transport material doped with one or more of an active metal and an active metal compound. An energy level difference between an LUMO level of the second functional layer and an HOMO level of the third functional layer is less than 1 electron Volt (eV).

In another aspect, a display substrate is provided in an embodiment of the present disclosure, including the OLED device described above.

In another aspect, a display apparatus is provided in an embodiment of the present disclosure, which includes the display substrate described above.

In another aspect, a manufacturing method of an OLED device is also provided in an embodiment of the present disclosure, which includes forming an anode, a first light-emitting unit and a cathode on a substrate. The forming the first light-emitting unit includes: forming a hole functional unit and a light-emitting layer in turn. The forming the hole functional unit includes forming a first functional layer for transporting electrons in contact with an anode and forming at least one hole functional layer. The hole functional layer includes at least a second functional layer for injecting holes and a third functional layer for transporting holes. The first functional layer includes an electron transport material doped with one or more of an active metal and an active metal compound. An energy level difference between an LUMO level of the second functional layer and an HOMO level of the third functional layer is less than 1 eV.

After reading and understanding the drawings and the detailed description, other aspects may be understood.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
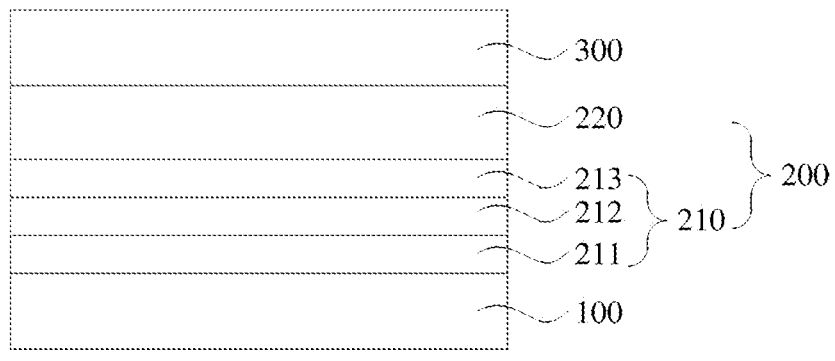
FIG. 1 is a schematic diagram of a structure of an OLED device provided in at least one embodiment of the present disclosure.

To make objectives, technical solutions, and advantages of the present disclosure clearer, the embodiments of the present disclosure will be described in detail with reference to the accompanying drawings. Implementation modes may be implemented in multiple different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one embodiment of the present disclosure is not necessarily limited to the size, and shapes and sizes of various components in the drawings do not reflect actual scales. In addition, the drawings schematically illustrate ideal examples, and one embodiment of the present disclosure is not limited to the shapes, numerical values, or the like shown in the drawings.

Ordinal numerals such as "first", "second" and "third" in the present disclosure are set to avoid confusion of constituents, but not intended for restriction in quantity. In the present disclosure, "multiple" represents two or more than two.

In the present disclosure, sometimes for convenience, wordings "central", "up", "down", "front", "back", "vertical", "horizontal", "top", "bottom", "inside", "outside" and the like indicating directional or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between constituent elements may be changed as appropriate based on the directions according to which the constituent elements are described. Therefore, appropriate replacements can be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, "electric connection" includes a case where constituent elements are connected through an element with a certain electrical action. The "element with the certain electrical effect" is not particularly limited as long as electrical signals may be sent and received between the connected constituent elements. Examples of the "element with the certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "about" refers to that a boundary is defined not so strictly and numerical values within process and measurement error ranges are allowed.

In the present disclosure, "energy level difference between energy levels A and B" refers to an absolute value of a difference between the energy levels A and B.

An OLED device is provided in at least one embodiment of the present disclosure, which includes an anode, a cathode, and a first light-emitting unit located between the anode and the cathode. The first light-emitting unit includes a light-emitting layer and a hole functional unit located between the anode and the light-emitting layer. The hole functional unit includes at least a first functional layer for transporting electrons and at least one hole functional layer located between the first functional layer and the light-emitting layer. The first functional layer is in contact with the anode. Any hole functional layer includes at least a second functional layer for injecting holes and a third functional layer for transporting holes. The first functional layer includes an electron transport material doped with one or more of an active metal and an active metal compound. Energy level difference between a Lowest Unoccupied Molecular Orbital (LUMO) level of the second functional layer and a High Occupied Molecular Orbital (HOMO) level of the third functional layer is less than 1 electron Volt (eV).

In this embodiment, the energy level difference between the LUMO energy level of the second functional layer and the HOMO energy level of the third functional layer is less than 1 eV, and a hole-electron pair is separated with the effect of an applied electric field. Wherein, electrons flow into the anode through the first functional layer, and because the electron transport material of the first functional layer is doped with one or more of the active metal and an active metal oxide, the electron injection and transport efficiency of the first functional layer can be increased without being affected by a work function of the anode. The holes are directly transported to the light-emitting layer through the HOMO energy level of the third functional layer. By arranging the hole functional unit between the anode and the light-emitting layer, the OLED device provided in the embodiment of the present disclosure can ameliorate the difficulty of injecting holes from the anode, effectively reduce an operating voltage of the OLED device and reduce a power consumption. Furthermore, the anode of the OLED device in the present embodiment is not limited to using a material with a high work function (for example, a work function greater than 5 eV), and a selectable range of anode materials can be expanded (for example, a material with a work function less than 5 eV can be selected).

In some exemplary embodiments, the anode is a reflecting electrode, and the cathode is an optically transparent electrode. In other words, the OLED device in the exemplary embodiment is an OLED device of a top emission structure. In some examples, the anode may be of a conductive material having a light reflection function, for example, any one or more of titanium (Ti), aluminum (Al), and molybdenum (Mo) and other metal materials, or a compound of the above metals, for example, titanium nitride (TiN). The anode may be of a monolayer structure, or a multilayer composite structure, such as, Ti/Al/TiN, Ti/Al/Ti, Ti/Al/Ti/Mo, Ti/Al. The cathode may be made of a conductive material transmitting light, for example, a transparent metal oxide such as Indium Zinc Oxide (IZO), or an alloy of magnesium (Mg) and silver (Ag), an alloy of ytterbium (Yb) and Ag, or the like. However, this embodiment is not limited thereto.

In some exemplary embodiments, each of the first functional layer, the second functional layer, and the third functional layer in the hole functional unit has a thickness ranging from 0.1 nanometer (nm) to 100 nm. In some examples, each of the first functional layer, the second functional layer and the third functional layer may have a thickness ranging from 10 nm to 50 nm. However, this embodiment is not limited thereto. For example, the first functional layer, the second functional layer, and the third functional layer may have different thickness selected according to different requirements.

In some exemplary embodiments, one or more of the active metal and the active metal compound doped in the first functional layer has a doping ratio in the first functional layer ranging from 0.1% to 30%. In other words, the mass of the doped material (i.e., one or more of the active metal and the active metal compound) in the first functional layer ranges from 0.1% to 30% of the total mass of the electron transport material and the doped material of the first functional layer. In some examples, the doping ratio of the doped material in the first functional layer may range from 0.1% to 5% in the first functional layer. For example, the doping ratio of the doped material in the first functional layer may be about 5% in the first functional layer. However, this embodiment is not limited thereto.

The "doping ratio" in the present disclosure refers to a ratio of the mass of a guest material to a total mass of a host material and the guest material.

In some exemplary embodiments, the active metal doped in the first functional layer may include alkali metals as well as other highly active metals such as ytterbium (Yb). The Alkali metals refer to the six metal elements of Group I A except hydrogen (H) in Periodic Table of Elements, namely lithium (Li), sodium (Na), potassium (K), rubidium (Rb), cesium (Cs) and francium (Fr). The active metal compounds doped in the first functional layer may include alkali metal compounds as well as other highly active metal compounds such as compounds of Yb. In some examples, Li may be doped in the electron transport material of the first functional layer. However, this embodiment is not limited thereto.

In some exemplary embodiments, the first functional layer may include a first material layer in contact with the anode, and a second material layer located between the first material layer and the hole functional layer. The first material layer includes a metal material, and the second material layer includes an electron transport material doped with one or more of an active metal and an active metal compound. In an exemplary embodiment, the first functional layer may be of a multi-layer structure. However, this embodiment is not limited thereto. In some examples, the first functional layer may be of a single-layer structure.

In some exemplary embodiments, the first functional layer has an LUMO energy level ranging from 2.0 eV to 3.0 eV, and the first functional layer has an HOMO energy level ranging from 4.5 eV to 7.0 eV.

In some exemplary embodiments, the second functional layer has an LUMO energy level ranging from 4.5 eV to 8.0 eV, and the third functional layer has an HOMO energy level ranging from 4.5 eV to 8.0 eV. In some examples, the third functional layer has an HOMO energy level ranging from 4.5 eV to 6.0 eV. However, this embodiment is not limited thereto.

FIG. 1 is a schematic diagram of a structure of an OLED device provided in at least one embodiment of the present disclosure. As shown in FIG. 1, the OLED device provided in the exemplary embodiment includes an anode 100, a cathode 300, and a first light-emitting unit 200 located between the anode 100 and the cathode 300. The first light-emitting unit 200 includes a hole functional unit 210 and a light-emitting layer 220 which are stacked in turn. The hole functional unit 210 is located between the anode 100 and the light-emitting layer 220. The hole functional unit 210 includes a first functional layer 211 for transporting electrons, a second functional layer 212 for injecting holes and a third functional layer 213 for transporting holes, which are stacked in turn. The first functional layer 211 is in contact with the anode 100. The first functional layer 211 is located between the anode 100 and the second functional layer 212, and the third functional layer 213 is located between the second functional layer 212 and the light-emitting layer 220. In the exemplary embodiment, the hole functional unit 210 includes a hole functional layer (i.e. including a stacked second functional layer 212 and a third functional layer 213).

In some exemplary embodiments, the anode 100 may be of a composite structure of Ti/Al/Ti or ITO/Ag/ITO. In some examples, the Ti has a thickness of about 20 nanometers (nm) and the Al has a thickness of about 70 nm. In some examples, the Ag has a thickness of about 100 nm and the ITO layer has a thickness of about 10 nm. A material of the cathode 300 may be an alloy material of Ag and Mg, wherein the mass of Mg accounts for about 15% of the total mass of the alloy. In some examples, the electron transport material of the first functional layer 211 may be Bphen (4,7-diphenyl-1,10-phenanthroline; 4,7-diphenylphenanthroline). The electron transport material of the first functional layer 211 may be doped with Li or LiQ (8-hydroxyquinoline lithium). A material of the second functional layer 212 may be HATCN (Dipyrazino [2,3-f:2',3'-h] quinoxaline-2,3,6,7,10, 11-hexacarbonitrile; 2,3,6,7,10,11-hexocyano-1,4,5,8,9,12-hexazabenzophenanthrene), LG101, F4-TCNQN, and other hole injection materials. A material of the third functional layer 213 may be NPB (N,N'-bis (naphthalen-1-yl)-N,N'-bis (phenyl)-benzidine; N,N'-diphenyl-N,N'-(1-naphthyl)-1,1'-biphenyl-4,4'-diamine (123847-85-8)). Each of the first functional layer 211, the second functional layer 212 and the third functional layer 213 may have a thickness ranging from 10 nm to 50 nm.

In some exemplary embodiments, taking the light-emitting layer 220 as a blue light-emitting layer as an example, MAND (2-methyl-9,10-bis(naphthalen-2-yl) anthracene) may be used as a blue light emitting material for the light-emitting layer 220. The light emitting material may not be doped or may be doped. For example, the MAND can be doped with DSA-Ph (1-4-di-[4-(N,N-diphenyl) amino] styryl-benzene; 1,4-bis [4-(dim-tolylamino) styrenyl] benzene) in a doping ratio of about 5%. A material of the light-emitting layer 220 may be selected as a light emitting material emitting red light (R), a green light (G) emitting material and a blue light (B) emitting material as required, or the light emitting material may be doped as required, and a doped guest may be a material that helps emitting corresponding fluorescence or phosphorescence. However, this embodiment is not limited thereto.

In some exemplary embodiments, the first light-emitting unit further includes at least one of the followings: a hole transport layer located between the hole functional unit and the light-emitting layer, an electron barrier layer located between the light-emitting layer and the hole transport layer, an electron transport layer located between the light-emitting layer and the cathode, an electron injection layer located between the electron transport layer and the cathode, and a hole barrier layer located between the light-emitting layer and the electron transport layer. In some examples the first light-emitting unit may include a hole functional unit, a light-emitting layer and an electron transport layer stacked in turn; alternatively, the first light-emitting unit may include a hole functional unit, a hole transport layer, a light-emitting layer and an electron transport layer stacked in turn; alternatively, the first light-emitting unit may include a hole functional unit, a hole transport layer, a light-emitting layer, an electron transport layer and an electron injection layer stacked in turn; alternatively, the first light-emitting unit may include a hole functional unit, a hole transport layer, an electron barrier layer, a light-emitting layer, an electron transport layer and an electron injection layer stacked in turn; alternatively, the first light-emitting unit may include a hole functional unit, a hole transport layer, an electron barrier layer, a light-emitting layer, a hole barrier layer, an electron transport layer, and an electron injection layer stacked in turn. However, this embodiment is not limited thereto.

In some exemplary embodiments, the electron transport material of the first functional layer may be the same as or different from a material of the electron transport layer. For example, the materials of the first functional layer and the electron transport layer may be the Bphen. A material of the second functional layer may be the HATCN. Materials of the third functional layer and the hole transport layer may be the same or different. For example, the material of the third functional layer and the hole transport layer may be the NPB. A material of the electron barrier layer may be DBTPB (N4,N4'-bis (dibenzo [b,d] thiophen-4-yl)-N4,N4'-diphenyl-biphenyl-4,4'-diaMine). A material of the electron injection layer may be LiQ or LiQ-doped Bphen. In some examples, a doping ratio of the LiQ in the electron injection layer may range from 0.1% to 60%, for example, the doping ratio may be 10%.

Figure 2:
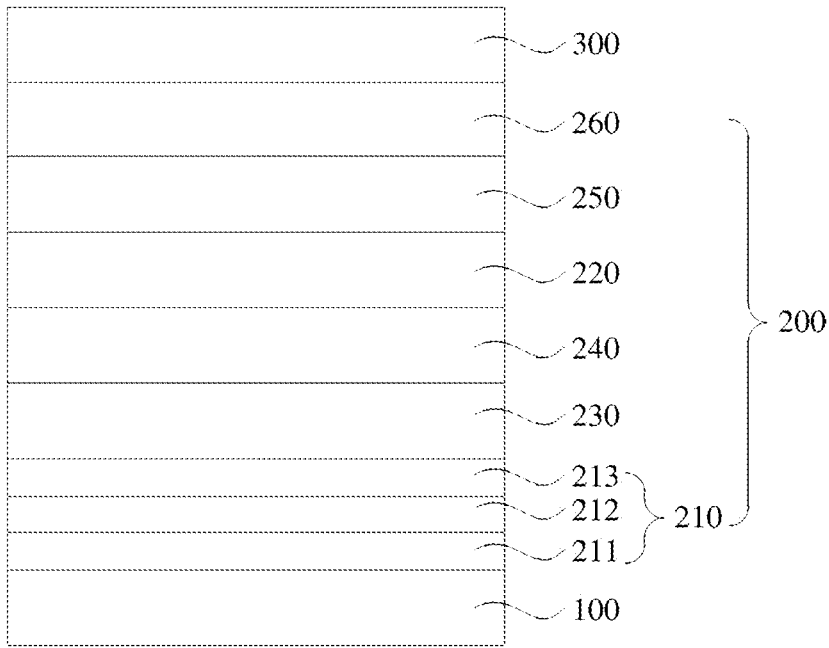
FIG. 2 is a schematic diagram of another structure of an OLED device provided in at least one embodiment of the present disclosure.

FIG. 2 is a schematic diagram of another structure of an OLED device provided in at least one embodiment of the present disclosure. As shown in FIG. 2, the OLED device in the exemplary embodiment includes an anode 100, a cathode 300, and a first light-emitting unit 200 located between the anode 100 and the cathode 300. The first light-emitting unit 200 includes a hole functional unit 210, a hole transport layer 230, an electron barrier layer 240, a light-emitting layer 220, an electron transport layer 250 and an electron injection layer 260 stacked in turn. The hole functional unit 210 is located between the anode 100 and the hole transport layer 230, the electron barrier layer 240 is located between the hole transport layer 230 and the light-emitting layer 220, the electron transport layer 250 is located between the light-emitting layer 220 and the electron injection layer 260, and the electron injection layer 260 is located between the electron transport layer 250 and the cathode 300. The hole functional unit 210 includes a first functional layer 211 for transporting electrons, a second functional layer 212 for injecting holes and a third functional layer 213 for transporting holes, which are stacked in turn. The first functional layer 211 is in contact with the anode 100. The first functional layer 211 is located between the anode 100 and the second functional layer 212, and the third functional layer 213 is located between the second functional layer 212 and the hole transport layer 230. In the exemplary embodiment, the hole functional unit 210 includes a hole functional layer (i.e. including a stacked second functional layer 212 and a third functional layer 213).

In some exemplary embodiments, taking the light-emitting layer 220 as a blue light-emitting layer as an example, a doped host of the light-emitting layer 220 is the MAND, and a doped guest of the light-emitting layer 220 is the DSA-Ph, with a doping ratio of 5%. In the exemplary embodiment, the anode 100 is of a Ti/Al/Ti composite structure in which the Ti has a thickness of 20 nm and the Al has a thickness of 70 nm. The cathode 300 is made of an alloy material of Ag and Mg, wherein the mass of the Mg is about 15% of the total mass of the alloy; the cathode 300 has a thickness of about 10 nm. A doped host of the first functional layer 211 of the hole functional unit 210 is the Bphen and a doped guest of the hole functional unit 210 is the Li with a doping ratio of about 5%; the first functional layer 211 has a thickness of about 20 nm. A material of the second functional layer 212 of the hole functional unit 210 is the HATCN and the second functional layer 212 has a thickness of about 10 nm. A material of the third functional layer 213 of the hole functional unit 210 is the NPB and the third functional layer 213 has a thickness of about 30 nm. A material of the hole transport layer 220 is the NPB and the hole transport layer 230 has a thickness of about 100 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 230 has a thickness of about 20 nm. A material of the electron transport layer 250 is the Bphen and the electron transport layer 250 has a thickness of about 35 nm. A material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213, and the thickness of the hole transport layer 230 is greater than that of the third functional layer 213.

Figure 3:
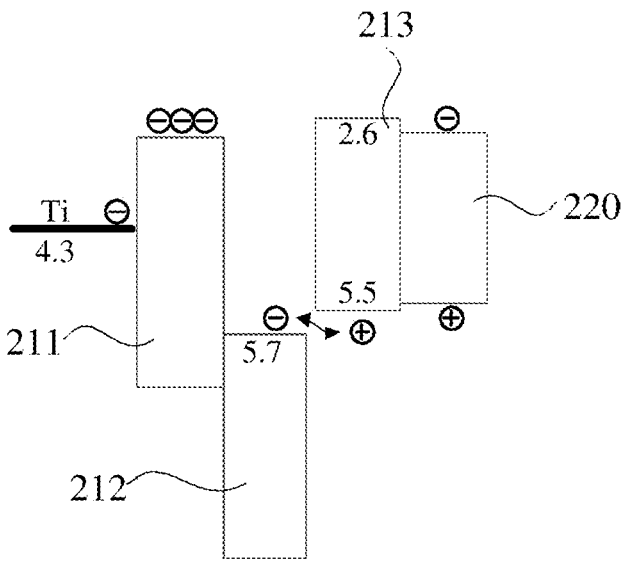
FIG. 3 is a schematic diagram of an energy level of a hole functional unit of an OLED device in at least one embodiment of the present disclosure.

FIG. 3 is a schematic diagram of an energy level of a hole functional unit of an OLED device in the exemplary embodiment. As shown in FIG. 3, a work function of the material Ti used for the anode 100 is about 4.3 eV. The LUMO energy level of the second functional layer 212 is 5.7 eV, and the HOMO energy level of the third functional layer 213 is 5.5 eV. An energy level difference (e.g. 0.2 eV) between the LUMO energy level (e.g. 5.7 eV) of the second functional layer 212 and the HOMO energy level (e.g. 5.5 eV) of the third functional layer 213 is less than 1 eV, and a hole-electron pair at an interface between the second functional layer 212 and the third functional layer 213 is separated by an applied electric field. Wherein, the electrons are transported to the first functional layer 211 and further transported to the anode; and the holes are transported through the HOMO energy level of the third functional layer 213 to the hole transport layer and further to the light-emitting layer 220. In the exemplary embodiment, the difficulty of injecting holes into the anode can be ameliorated, effectively reducing the operating voltage of the OLED device, and expanding the selectable range of anode materials (for example, a material with a work function less than 5 eV can be selected).

In some exemplary embodiments, taking the light-emitting layer 220 as the blue light-emitting layer as an example, the doped host of the light-emitting layer 220 is the MAND, and the doped guest of the light-emitting layer 220 is the DSA-Ph, with the doping ratio of 5%. In the exemplary embodiment, the anode 100 is of the Ti/Al/Ti composite structure in which the Ti has a thickness of 20 nm and the Al has a thickness of 70 nm. The cathode 300 is made of the alloy material of Ag and Mg, wherein the mass of the Mg is about 15% of the total mass of the alloy; the cathode 300 has a thickness of about 10 nm. A doped host of the first functional layer 211 of the hole functional unit 210 is the Bphen and the doped guest of the first functional layer 211 of the hole functional unit 210 is the LiQ with a doping ratio of about 5%; the first functional layer 211 has a thickness of about 20 nm. A material of the second functional layer 212 of the hole functional unit 210 is the HATCN and the second functional layer 212 has a thickness of about 10 nm. A material of the third functional layer 213 of the hole functional unit 210 is the NPB and the third functional layer 213 has a thickness of about 30 nm. A material of the hole transport layer 230 is the NPB and the hole transport layer 230 has a thickness of about 10 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 220 has a thickness of about 20 nm. A material of the electron transport layer 250 is the Bphen and the electron transport layer 250 has a thickness of about 35 nm. A material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213, and the thickness of the hole transport layer 230 is less than that of the third functional layer 213. The schematic diagram of the energy level of the hole functional unit of the OLED device in the exemplary embodiment of the exemplary embodiment can be shown with reference to FIG. 3 and therefore will not be repeated here.

In some exemplary embodiments, any hole functional layer may further include a fourth functional layer located between the second functional layer and the third functional layer, and the fourth functional layer is a mixed layer including a hole injection material and a hole transport material. An energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV. In some examples, the hole injection material of the fourth functional layer is the same as the material of the second functional layer, and the hole transport material of the fourth functional layer is the same as the material of the third functional layer. However, this embodiment is not limited thereto. In some examples, the hole injection material of the fourth functional layer may be different from the material of the second functional layer, or the hole transport material of the fourth functional layer may be different from the material of the third functional layer.

In some exemplary embodiments, the doping ratio of the hole injection material of the fourth functional layer may range from 0.1% to 20% in the fourth functional layer. In some examples, the doping ratio of the hole injection material is about 2% in the fourth functional layer. However, this embodiment is not limited thereto.

Figure 4:
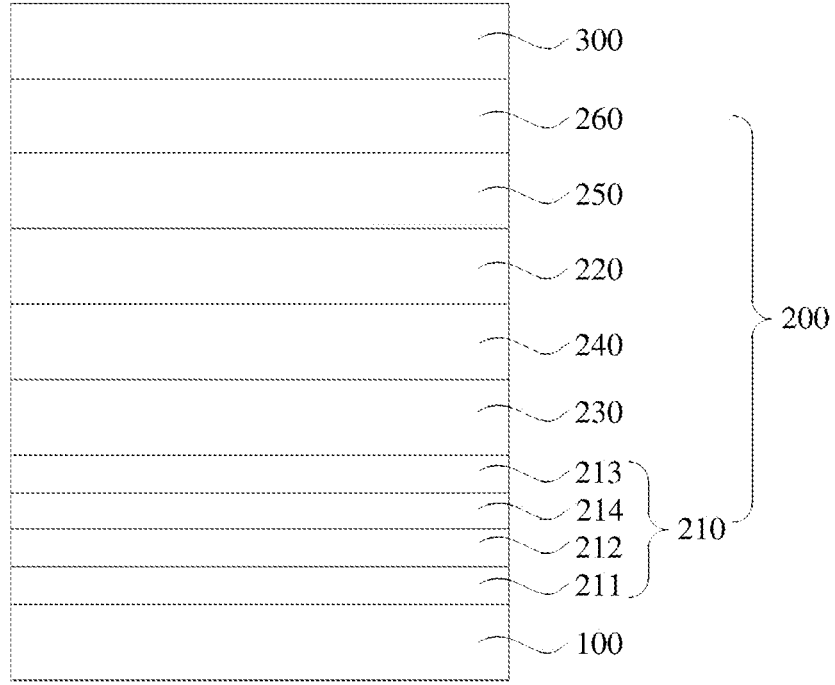
FIG. 4 is a schematic diagram of another structure of an OLED device provided in at least one embodiment of the present disclosure.

FIG. 4 is a schematic diagram of another structure of an OLED device provided in at least one embodiment of the present disclosure. As shown in FIG. 4, the OLED device in the exemplary embodiment includes an anode 100, a cathode 300, and a first light-emitting unit 200 located between the anode 100 and the cathode 300. The first light-emitting unit 200 includes a hole functional unit 210, a hole transport layer 230, an electron barrier layer 240, a light-emitting layer 220, an electron transport layer 250 and an electron injection layer 260 stacked in turn. The hole functional unit 210 is located between the anode 100 and the hole transport layer 230, the electron barrier layer 240 is located between the hole transport layer 230 and the light-emitting layer 220, the electron transport layer 250 is located between the light-emitting layer 220 and the electron injection layer 260, and the electron injection layer 260 is located between the electron transport layer 250 and the cathode 300. The hole functional unit 210 includes a first functional layer 211, a second functional layer 212, a fourth functional layer 214 and a third functional layer 213 stacked in turn. The first functional layer 211 is in contact with the anode 100. The first functional layer 211 is located between the anode 100 and the second functional layer 212, the fourth functional layer 214 is located between the second functional layer 212 and the third functional layer 213, and the third functional layer 213 is located between the fourth functional layer 214 and the hole transport layer 230. In the exemplary embodiment, the hole functional unit 210 includes a hole functional layer (i.e. including the second functional layer 212 stacked with the fourth functional layer 214 and the third functional layer 213).

In some exemplary embodiments, taking the light-emitting layer 220 as the blue light-emitting layer as an example, the doped host of the light-emitting layer 220 is the MAND, and the doped guest of the light-emitting layer 220 is the DSA-Ph, with the doping ratio of 5%. In the exemplary embodiment, the anode 100 is of the Ti/Al/Ti composite structure in which the Ti has a thickness of 20 nm and the Al has a thickness of 70 nm. The cathode 300 is made of an alloy material of Ag and Mg, wherein the mass of the Mg is about 15% of the total mass of the alloy; the cathode 300 has a thickness of about 10 nm. The doped host of the first functional layer 211 of the hole functional unit 210 is the Bphen and the doped guest of the first functional layer 211 of the hole functional unit 210 is the LiQ with a doping ratio of about 10%; the first functional layer 211 has a thickness of about 20 nm. The material of the second functional layer 212 of the hole functional unit 210 is the HATCN and the second functional layer 212 has a thickness of about 10 nm. A doped host of the fourth functional layer 214 of the hole functional unit 210 is the NPB and a doped guest of the hole functional unit 210 is the HATCH with a doping ratio of 1%; the fourth functional layer 214 has a thickness of about 10 nm. Both of the material of the third functional layer 213 of the hole functional unit 210 and the material of the hole transport layer 230 are the NPB, and a total thickness of the third functional layer 213 and the hole transport layer 230 is about 120 nm. For example, the third functional layer 213 has a thickness of about 20 nm and the hole transport layer 230 has a thickness of about 100 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 220 has a thickness of about 20 nm. The material of the electron transport layer 250 is the Bphen and the electron transport layer 250 has a thickness of about 35 nm. The material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213. The hole injection material used in the fourth functional layer 214 is the same as that of the second functional layer 212, and the hole transport material used in the fourth functional layer 214 is the same as that of the third functional layer 213. The material of the first functional layer 211 is the same as that of the electron injection layer 260.

Figure 5:
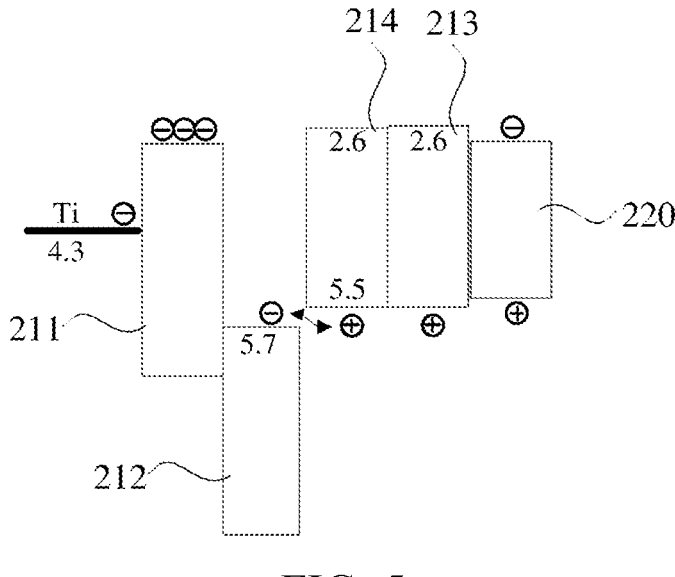
FIG. 5 is a schematic diagram of another energy level of a hole functional unit of an OLED device in at least one exemplary embodiment of the present disclosure.

FIG. 5 is a schematic diagram of an energy level of a hole functional unit of an OLED device in the exemplary embodiment. As shown in FIG. 5, a work function of the material Ti used for the anode 100 is about 4.3 eV. The LUMO energy level of the second functional layer 212 is 5.7 eV, and the HOMO energy level of the fourth functional layer 214 is 5.5 eV. An energy level difference (e.g. 0.2 eV) between the LUMO energy level (e.g. 5.7 eV) of the second functional layer 212 and the HOMO energy level (e.g. 5.5 eV) of the fourth functional layer 214 is less than 1 eV, and a hole-electron pair at an interface between the second functional layer 212 and the fourth functional layer 214 is separated by an applied electric field. Wherein, electrons are transported to the first functional layer 211 and further transported to the anode; the holes are transported to the hole transport layer through the HOMO energy levels of the fourth functional layer 214 and the third functional layer 213 and further to the light-emitting layer 220. In the exemplary embodiment, the situation, where hole injection is difficult due to the low anode work function, can be effectively ameliorated, the operating voltage of the OLED device can be effectively reduced, and the selectable range of anode materials can be expanded (for example, materials with a work function less than 5 eV may be selected).

Figure 6:
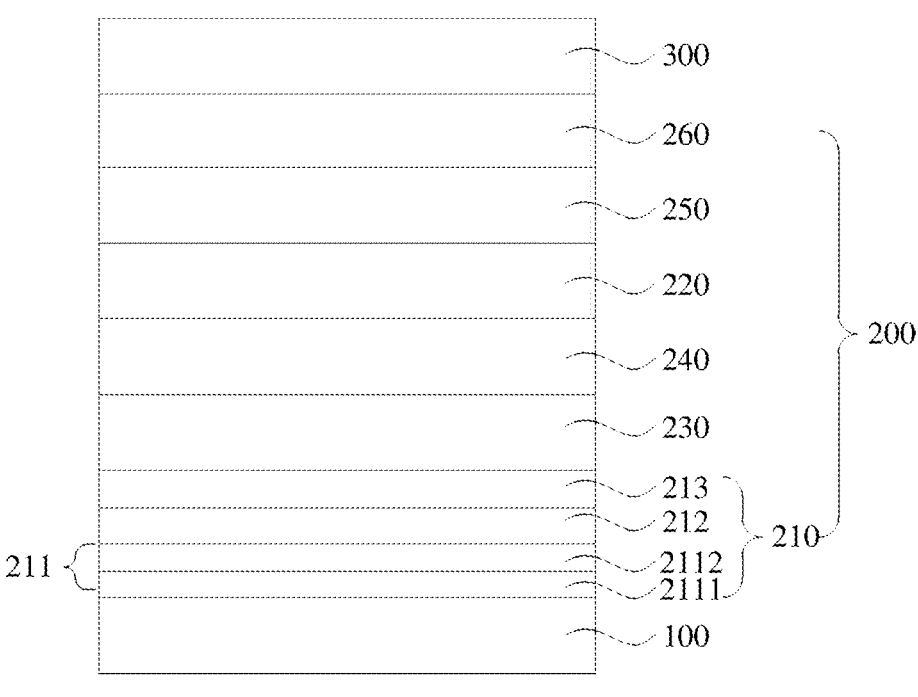
FIG. 6 is a schematic diagram of another structure of an OLED device provided in at least one embodiment of the present disclosure.

FIG. 6 is a schematic diagram of another structure of an OLED device provided in at least one embodiment of the present disclosure. As shown in FIG. 6, the OLED device in the exemplary embodiment includes an anode 100, a cathode 300, and a first light-emitting unit 200 located between the anode 100 and the cathode 300. The first light-emitting unit 200 includes a hole functional unit 210, a hole transport layer 230, an electron barrier layer 240, a light-emitting layer 220, an electron transport layer 250 and an electron injection layer 260 stacked in turn. The hole functional unit 210 is located between the anode 100 and the hole transport layer 230, the electron barrier layer 240 is located between the hole transport layer 230 and the light-emitting layer 220, the electron transport layer 250 is located between the light-emitting layer 220 and the electron injection layer 260, and the electron injection layer 260 is located between the electron transport layer 250 and the cathode 300. The hole functional unit 210 includes a first functional layer 211, a second functional layer 212 and a third functional layer 213 stacked in turn. The first functional layer 211 is located between the anode 100 and the second functional layer 212, and the third functional layer 214 is located between the second functional layer 212 and the hole transport layer 230. The first functional layer 211 includes a first material layer 2111 stacked with a second material layer 2112. The first material layer 2111 is in contact with the anode 100. The second material layer 2112 is located between the first material layer 2111 and the second functional layer 212. In some example, the first material layer 2111 may be made of a metallic material, such as molybdenum (Mo). However, this embodiment is not limited thereto. In the exemplary embodiment, the hole functional unit 210 includes a hole functional layer (i.e. including a stacked second functional layer 212 and a third functional layer 213). Furthermore, the first functional layer 211 is of a multi-layer structure.

In some exemplary embodiments, taking the light-emitting layer 220 as the blue light-emitting layer as an example, the doped host of the light-emitting layer 220 is the MAND, and the doped guest of the light-emitting layer 220 is the DSA-Ph, with the doping ratio of 5%. In the exemplary embodiment, the anode 100 is of the Ti/Al/Ti composite structure in which the Ti has a thickness of 20 nm and the Al has a thickness of 70 nm. The cathode 300 is made of an alloy material of Ag and Mg, wherein the mass of the Mg is about 15% of the total mass of the alloy; the cathode 300 has a thickness of about 10 nm. A material of the first material layer 2111 of the first functional layer 211 is Mg and the first material layer 2111 has a thickness of 2 nm. A doped host of the second material layer 2112 of the first functional unit 211 is the Bphen and the doped guest of the second material layer 2112 of the first functional unit 211 is the Li with a doping ratio of about 5%; the second functional layer 2112 has a thickness of about 20 nm. The material of the second functional layer 212 of the hole functional unit 210 is the HATCN and the second functional layer 212 has a thickness of about 10 nm. The material of the third functional layer 213 of the hole functional unit 210 is the NPB and the third functional layer 213 has a thickness of about 20 nm. A material of the hole transport layer 230 is the NPB and the hole transport layer 230 has a thickness of about 100 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 230 has a thickness of about 20 nm. A material of the electron transport layer 250 is the Bphen and the electron transport layer 250 has a thickness of about 35 nm. A material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213.

Figure 7:
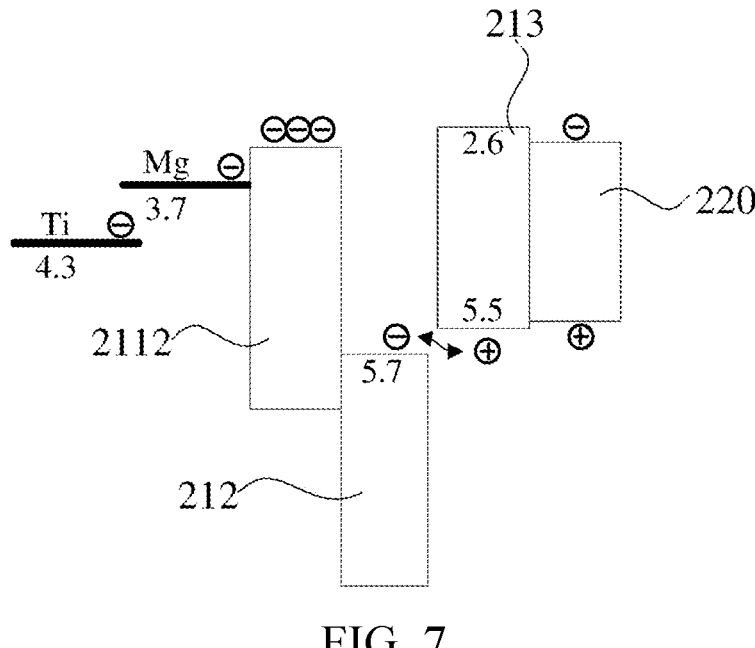
FIG. 7 is a schematic diagram of another energy level of a hole functional unit of an OLED device in at least one embodiment of the present disclosure.

FIG. 7 is a schematic diagram of an energy level of a hole functional unit of an OLED device in the exemplary embodiment. As shown in FIG. 7, a work function of the material Ti used for the anode 100 is about 4.3 eV. A work function of a material Mg used in the first material layer is about 3.7 eV. An LUMO energy level of the second functional layer 212 is 5.7 eV, and an HOMO energy level of the third functional layer 213 is 5.5 eV. An energy level difference (e.g. 0.2 eV) between the LUMO energy level (e.g. 5.7 eV) of the second functional layer 212 and the HOMO energy level (e.g. 5.5 eV) of the third functional layer 213 is less than 1 eV, and a hole-electron pair at an interface between the second functional layer 212 and the third functional layer 213 is separated by an applied electric field. Wherein electrons are transported to the second material layer 2112 and further through the first material layer (e.g. Mg) to the anode; and the holes are transported through the HOMO energy level of the third functional layer 213 to the hole transport layer and further to the light-emitting layer 220. In the exemplary embodiment, the situation, where hole injection is difficult due to the low anode work function, can be effectively ameliorated, the operating voltage of the OLED device can be effectively reduced, and the selectable range of anode materials can be expanded (for example, materials with a work function less than 5 eV may be selected). Moreover, a transporting efficiency of the electrons from the second material layer to the anode can be improved by the Mg.

Figure 8:
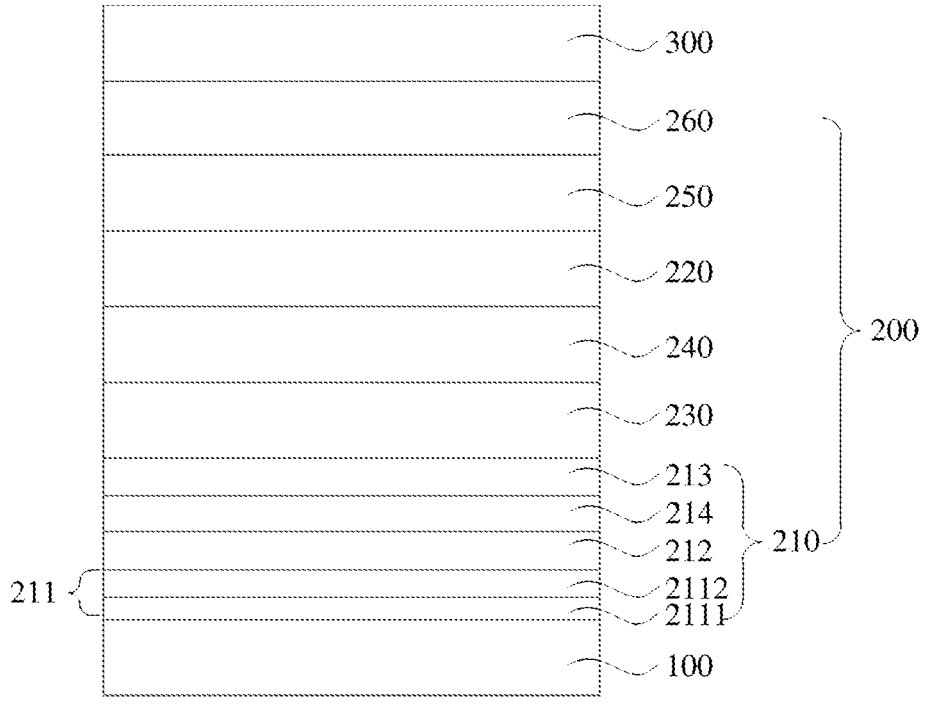
FIG. 8 is a schematic diagram of another structure of an OLED device provided in at least one embodiment of the present disclosure.

FIG. 8 is a schematic diagram of another structure of an OLED device provided in at least one embodiment of the present disclosure. As shown in FIG. 8, the OLED device in the exemplary embodiment includes an anode 100, a cathode 300, and a first light-emitting unit 200 located between the anode 100 and the cathode 300. The first light-emitting unit 200 includes a hole functional unit 210, a hole transport layer 230, an electron barrier layer 240, a light-emitting layer 220, an electron transport layer 250 and an electron injection layer 260 stacked in turn. The hole functional unit 210 is located between the anode 100 and the hole transport layer 230, the electron barrier layer 240 is located between the hole transport layer 230 and the light-emitting layer 220, the electron transport layer 250 is located between the light-emitting layer 220 and the electron injection layer 260, and the electron injection layer 260 is located between electron transport layer 250 and the cathode 300. The hole functional unit 210 includes a first functional layer 211, a second functional layer 212, a fourth functional layer 214 and a third functional layer 213 stacked in turn. The first functional layer 211 is located between the anode 100 and the second functional layer 212, the fourth functional layer 214 is located between the second functional layer 212 and the third functional layer 213, and the third functional layer 213 is located between the fourth functional layer 214 and the hole transport layer 230. The first functional layer 211 includes a first material layer 2111 stacked with a second material layer 2112. The first material layer 2111 is in contact with the anode 100. The second material layer 2112 is located between the first material layer 2111 and the second functional layer 212. In some example, the first material layer 2111 may be made of a metallic material, such as molybdenum (Mo). However, this embodiment is not limited thereto. In the exemplary embodiment, the hole functional unit 210 includes a hole functional layer (i.e. including the second functional layer 212 stacked with the fourth functional layer 214 and the third functional layer 213). Furthermore, the first functional layer 211 is of a multi-layer structure.

In some exemplary embodiments, taking the light-emitting layer 220 as the blue light-emitting layer as an example, the doped host of the light-emitting layer 220 is the MAND, and the doped guest of the light-emitting layer 220 is the DSA-Ph, with the doping ratio of 5%. In the exemplary embodiment, the anode 100 is of the Ti/Al/Ti composite structure in which the Ti has a thickness of 20 nm and the Al has a thickness of 70 nm. The cathode 300 is made of an alloy material of Ag and Mg, wherein the mass of the Mg is about 15% of the total mass of the alloy; the cathode 300 has a thickness of about 10 nm. The doped host of the first functional layer 211 of the hole functional unit 210 is the Bphen and the doped guest of the first functional layer 211 of the hole functional unit 210 is the LiQ with a doping ratio of about 5%; the first functional layer 211 has a thickness of about 20 nm. A material of the second functional layer 212 of the hole functional unit 210 is the HATCN and the second functional layer 212 has a thickness of about 10 nm. A doped host of the fourth functional layer 214 of the hole functional unit 210 is the NPB and a doped guest of the hole functional unit 210 is the HATCH with a doping ratio of 1%; the fourth functional layer 214 has a thickness of about 10 nm. Both of the material of the third functional layer 213 of the hole functional unit 210 and the material of the hole transport layer 230 are the NPB, and a total thickness of the third functional layer 213 and the hole transport layer 230 is about 118 nm. For example, the third functional layer 213 has a thickness of about 18 nm and the hole transport layer 230 has a thickness of about 100 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 220 has a thickness of about 20 nm. A material of the electron transport layer 250 is the Bphen and the electron transport layer 250 has a thickness of about 35 nm. A material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213. The hole injection material used in the fourth functional layer 214 is the same as that of the second functional layer 212, and the hole transport material used in the fourth functional layer 214 is the same as that of the third functional layer 213. Furthermore, the first functional layer 211 is of a multi-layer structure.

Figure 9:
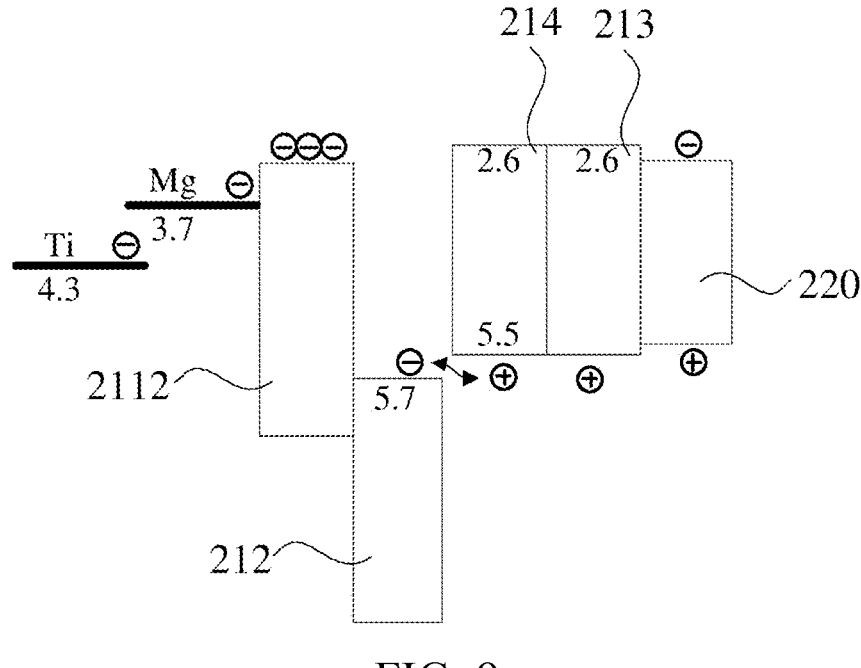
FIG. 9 is a schematic diagram of another energy level of a hole functional unit of an OLED device in at least one exemplary embodiment of the present disclosure.

FIG. 9 is a schematic diagram of an energy level of a hole functional unit of an OLED device in the exemplary embodiment. As shown in FIG. 9, a work function of the material Ti used for the anode 100 is about 4.3 eV. A work function of a material Mg used in the first material layer is about 3.7 eV. The LUMO energy level of the second functional layer 212 is 5.7 eV, and the HOMO energy level of the fourth functional layer 214 is 5.5 eV. An energy level difference (e.g. 0.2 eV) between the LUMO energy level (e.g. 5.7 eV) of the second functional layer 212 and the HOMO energy level (e.g. 5.5 eV) of the fourth functional layer 214 is less than 1 eV, and a hole-electron pair at an interface between the second functional layer 212 and the fourth functional layer 214 is separated by an applied electric field. Wherein electrons are transported to the second material layer 2112 and further through the first material layer (e.g. Mg) to the anode; and the holes are transported through the HOMO energy level of the third functional layer 213 to the hole transport layer and further to the light-emitting layer 220. In the exemplary embodiment, the situation, where hole injection is difficult due to the low anode work function, can be effectively ameliorated, the operating voltage of the OLED device can be effectively reduced, and the selectable range of anode materials can be expanded (for example, materials with a work function less than 5 eV may be selected). Moreover, a transporting efficiency of the electrons from the second material layer to the anode can be improved by the Mg.

Figure 10:
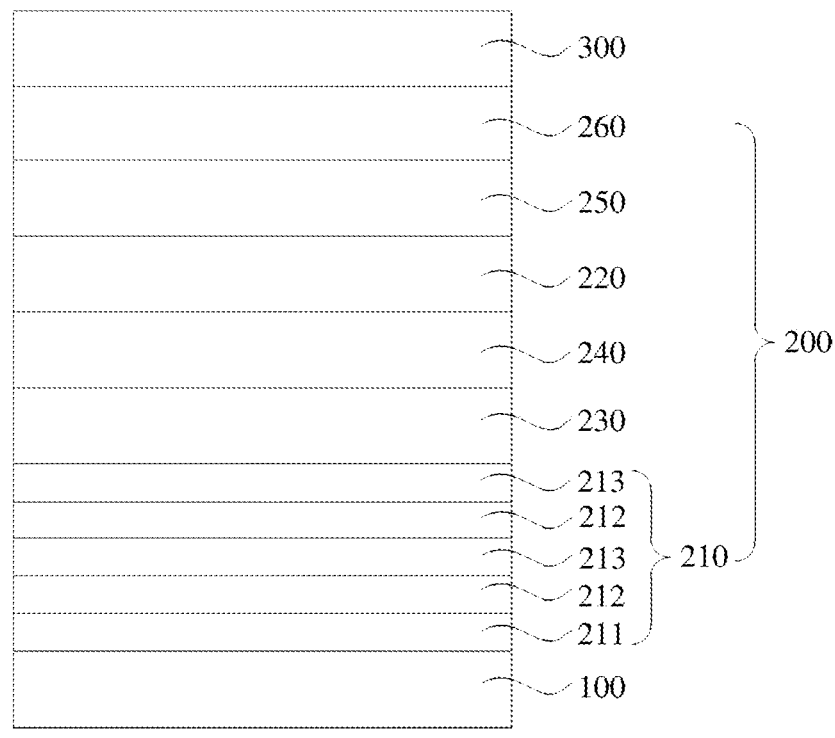
FIG. 10 is a schematic diagram of another structure of an OLED device provided in at least one embodiment of the present disclosure.

FIG. 10 is a schematic diagram of another structure of an OLED device provided in at least one embodiment of the present disclosure. As shown in FIG. 10, the OLED device in the exemplary embodiment includes an anode 100, a cathode 300, and a first light-emitting unit 200 located between the anode 100 and the cathode 300. The first light-emitting unit 200 includes a hole functional unit 210, a hole transport layer 230, an electron barrier layer 240, a light-emitting layer 220, an electron transport layer 250 and an electron injection layer 260 stacked in turn. The hole functional unit 210 is located between the anode 100 and the hole transport layer 230, the electron barrier layer 240 is located between the hole transport layer 230 and the light-emitting layer 220, the electron transport layer 250 is located between the light-emitting layer 220 and the electron injection layer 260, and the electron injection layer 260 is located between the electron transport layer 250 and the cathode 300. The hole functional unit 210 includes a first functional layer 211 for transporting electrons and two hole functional layers, which are stacked in turn. Each hole functional layer includes a second functional layer 212 injecting holes and a third functional layer 213 transporting hole which are stacked. In the exemplary embodiment, the hole functional unit 210 includes a first functional layer 211, a second functional layer 212, a third functional layer 213, a second functional layer 212 and a third functional layer 213, which are stacked in turn. However, this embodiment is not limited thereto. In some examples, the hole functional unit may include three or more hole functional layers.

In some examples, when the hole functional unit includes a first functional layer and a plurality of hole functional layers, numbers of functional layers included in different hole functional layers may be the same or different. For example, the hole functional unit may include a first functional layer and three hole functional layers, each of the hole functional layers may include a second functional layer and a third functional layer which are stacked, or each of the hole functional layers may include a second functional layer, a fourth functional layer and a third functional layer which are stacked. For example, the hole functional unit may include a first functional layer and two hole functional layers, one of the hole functional layers may include a second functional layer, a fourth functional layer and a third functional layer which are stacked, and another one of the hole functional layers may include a second functional layer and a third functional layer which are stacked.

In some examples, when the hole functional unit includes a first functional layer and a plurality of hole functional layers, materials of second functional layers of different hole functional layers may be the same, or materials of third functional layers of the different hole functional layers may be the same, or materials of fourth functional layers of the different hole functional layers may be the same. However, this embodiment is not limited thereto. In some examples, when the hole functional unit includes a first functional layer and a plurality of hole functional layers, materials of second functional layers of different hole functional layers may be different, or materials of third functional layers of the different hole functional layers may be different, or materials of fourth functional layers of the different hole functional layers may be different.

In some examples, when the hole functional unit includes a first functional layer and a plurality of hole functional layers, thicknesses of second functional layers of different hole functional layers may be the same, or thicknesses of third functional layers of the different hole functional layers may be the same, or thicknesses of fourth functional layers of the different hole functional layers may be the same. However, this embodiment is not limited thereto. In some examples, when the hole functional unit includes a first functional layer and a plurality of hole functional layers, thicknesses of second functional layers of different hole functional layers may be different, or thicknesses of third functional layers of the different hole functional layers may be different, or thicknesses of fourth functional layers of the different hole functional layers may be different.

In some exemplary embodiments, taking the light-emitting layer 220 as the blue light-emitting layer as an example, the doped host of the light-emitting layer 220 is the MAND, and the doped guest of the light-emitting layer 220 is the DSA-Ph, with the doping ratio of 5%. In the exemplary embodiment, the anode 100 is of the Ti/Al/Ti composite structure in which the Ti has a thickness of 20 nm and the Al has a thickness of 70 nm. The cathode 300 is made of an alloy material of Ag and Mg, wherein the mass of the Mg is about 15% of the total mass of the alloy; the cathode 300 has a thickness of about 10 nm. A doped host of the first functional layer 211 is the Bphen and a doped guest of the hole functional unit 210 is the Li with a doping ratio of about 5%; the first functional layer 211 has a thickness of about 20 nm. A material of the second functional layer 212 of the hole functional unit 210 is the HATCN and the second functional layer 212 has a thickness of about 10 nm. A material of the third functional layer 213 of the hole functional unit 210 is the NPB and the third functional layer 213 has a thickness of about 10 nm. A material of the hole transport layer 230 is the NPB and the hole transport layer 230 has a thickness of about 80 nm. A material of the electron barrier layer 240 is the DBTPB and the electron barrier layer 240 has a thickness of about 4 nm. A material of the light-emitting layer 220 is the MAND: DSA-Ph (5%) and the light-emitting layer 230 has a thickness of about 20 nm. A material of the electron transport layer 250 is the Bphen and the electron transport layer 250 has a thickness of about 35 nm. A material of the electron injection layer 260 is the Bphen doped with the LiQ (with a doping ratio of 10%) and the electron injection layer 260 has a thickness of about 80 nm. In the exemplary embodiment, the material of the hole transport layer 230 is the same as that of the third functional layer 213.

Figure 11:
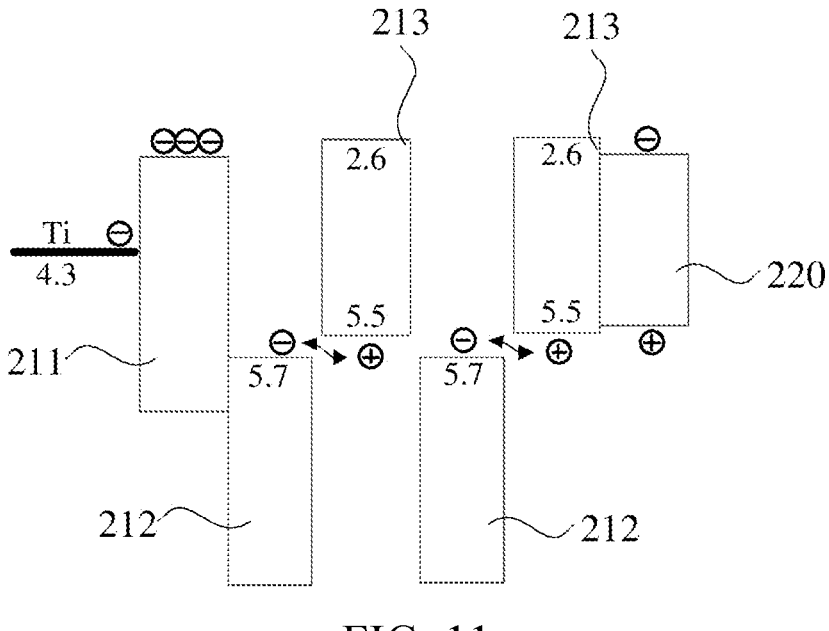
FIG. 11 is a schematic diagram of another energy level of a hole functional unit of an OLED device in at least one embodiment of the present disclosure.

FIG. 11 is a schematic diagram of an energy level of a hole functional unit of an OLED device in the exemplary embodiment. As shown in FIG. 11, a work function of the material Ti used for the anode 100 is about 4.3 eV. In either hole functional layer, an LUMO energy level of the second functional layer 212 is 5.7 eV, and an HOMO energy level of the third functional layer 213 is 5.5 eV. An energy level difference (e.g. 0.2 eV) between the LUMO energy level (e.g. 5.7 eV) of the second functional layer 212 and the HOMO energy level (e.g. 5.5 eV) of the third functional layer 213 in either hole functional layer is less than 1 eV, and a hole-electron pair at an interface between the second functional layer 212 and the third functional layer 213 is separated by an applied electric field. Overall the hole functional unit, electrons are transported to a direction of the anode, and holes are transported to a direction of the light-emitting layer. In the exemplary embodiment, the difficulty of injecting holes into the anode can be ameliorated, effectively reducing the operating voltage of the OLED device, and expanding the selectable range of anode materials (for example, a material with a work function less than 5 eV can be selected).

In some exemplary embodiments, an OLED device includes an anode, a cathode, and a first light-emitting unit and at least one second light emitting unit stacked between the anode and the cathode. The second light emitting unit is located between the first light-emitting unit and the cathode. Adjacent light emitting units are connected by a connection layer. The first light-emitting unit and the second light emitting unit display different colors. The second light emitting unit includes a second light-emitting layer and at least one of a hole injection layer, a hole transport layer, an electron barrier layer, an electron transport layer, an electron injection layer, and a hole barrier layer. In the exemplary embodiment, the OLED device is of a Tandem device structure, and the first light-emitting unit and at least one second light emitting unit share an anode and a cathode, which can improve a light emitting efficiency of the OLED device and prolong a service life of the OLED device. However, this embodiment is not limited thereto.

Figure 12:
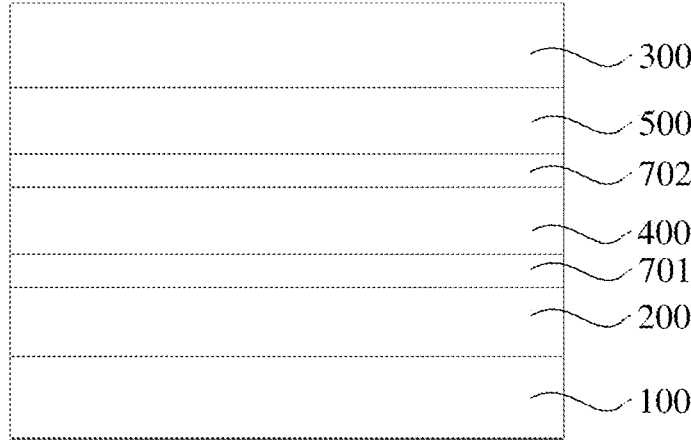
FIG. 12 is a schematic diagram of another structure of an OLED device provided in at least one embodiment of the present disclosure.

FIG. 12 is a schematic diagram of another structure of an OLED device provided in at least one embodiment of the present disclosure. As shown in FIG. 12, the OLED device provided in the exemplary embodiment includes an anode 100, a cathode 300, and a first light-emitting unit 200 and two second light emitting units stacked, in turn, between the anode 100 and the cathode 300. The first light-emitting unit 200 is configured to emit light of a first color. The two second light emitting units include a light emitting unit 400 that emits light of a second color and a light emitting unit 500 that emits light of a third color. A connection layer is provided between adjacent light emitting units. As shown in FIG. 12, a first connection layer 701 configured to connect the first light-emitting unit 200 and the light emitting unit 400 in series is provided between the first light-emitting unit 200 and the light emitting unit 400 emitting the second color light; a second connection layer 702 configured to connect the light emitting units 400 and 500 in series is provided between the light emitting unit 400 emitting the second color light and the light emitting unit 500 emitting the third color light, which perform carrier transfer. A structure of the first light-emitting unit 200 may refer to the description of the foregoing embodiments, which will not be repeated here. In some examples the light emitting unit 400 emitting the second color light may include a hole transport layer, a light-emitting layer and an electron transport layer stacked in turn. The light emitting unit 500 emitting the third color light may include a hole transport layer, a light-emitting layer and an electron transport layer stacked in turn. Since the OLED device in the exemplary embodiment includes a first light-emitting unit 200 emitting light of a first color, a light emitting unit 400 emitting light of a second color, and a light emitting unit 500 emitting light of a third color, light finally emitted by the OLED device is mixed light. For example, the first light-emitting unit 200 emits red light, the light emitting unit 400 emits green light, the light emitting unit 500 emits blue light, and the OLED device finally emits white light.

A comparison of a luminescence performance of OLED devices of different structures is illustrated by Table 1 below. Table 1 schematically illustrates the luminescence performance of the OLED devices in a comparative example, Example 1 and Example 2.

TABLE 1

|  | Current density (mA/cm2) | operating voltage (V) | luminous efficiency (cd/A) |
|---|---|---|---|
| Comparative example | 10 | 5.88 | 4.35 |
| Example 1 | 10 | 4.73 | 5.87 |
| Example 2 | 10 | 4.61 | 5.72 |

In order to facilitate comparison, a same basic structure is used in the comparative example, Example 1 and Example 2. For example, a structure shown in FIG. 2 is used in Example 1, and a structure shown in FIG. 10 is used in Example 2. A difference between Example 1 and Example 2 is that the OLED device in Example 1 includes one hole functional layer and the OLED device in Example 2 includes two hole functional layers. A difference between the structure in the comparative example and the structure in Example 1 is that an OLED device in the comparative example does not include a hole functional unit but provides a hole injection layer between the anode and the hole transport layer.

In the comparative example, the OLED device may be formed on a silicon-based substrate. The anode is of a Ti/Al/Ti composite structure, in which the Ti has a thickness of 20 nm and the Al has a thickness of 70 nm; the cathode material is made of an alloy material of Ag and Mg, in which the mass of the Mg accounts for about 15% of the total mass of the alloy; the cathode has a thickness of about 10 nm. Between the anode and the cathode, a hole injection layer (the HATCN material, 10 nm in thickness), a hole transport layer (the NPB material, 150 nm in thickness), an electron barrier layer (the DBTPB material, 4 nm in thickness), a light-emitting layer (a blue light-emitting layer made of the MAND: DSA-Ph (5%) material and had a thickness of 20 nm is taken as an example), an electron transport layer (the Bphen material, 35 nm in thickness), and an electron injection layer (the Bphen: LiQ (10%) material, 80 nm in thickness) are included in turn.

In Examples 1 and 2, the materials and thicknesses of the substrate, the anode, the cathode, the electron barrier layer, the light-emitting layer, the electron transport layer, and the electron injection layer employed are the same as those in the comparative example.

In Example 1, between the anode and the cathode, a first functional layer (the Bphen: Li (5%) material, 20 nm in thickness), a second functional layer (the HATCN material, 10 nm in thickness), a third functional layer (the NPB material, 30 nm in thickness), a hole transport layer (the NPB material, 100 nm in thickness), an electron barrier layer, a light-emitting layer, an electron transport layer and an electron injection layer are included in turn.

In Example 2, between the anode and the cathode, a first functional layer (the Bphen: Li (5%) material, 20 nm in thickness), a second functional layer (the HATCN material, 10 nm in thickness), a third functional layer (the NPB material, 10 nm in thickness), a second functional layer (the HATCN material, 10 nm in thickness), a third functional layer (the NPB material, 10 nm in thickness), a hole transport layer (the NPB material, 80 nm in thickness), an electron barrier layer, a light-emitting layer, an electron transport layer and an electron injection layer are included in turn.

As can be seen from Table 1, the operating voltages of the OLED devices in Examples 1 and 2 are significantly reduced and the luminous efficiencies are effectively improved compared with the OLED device in the comparative example.

Figure 13:
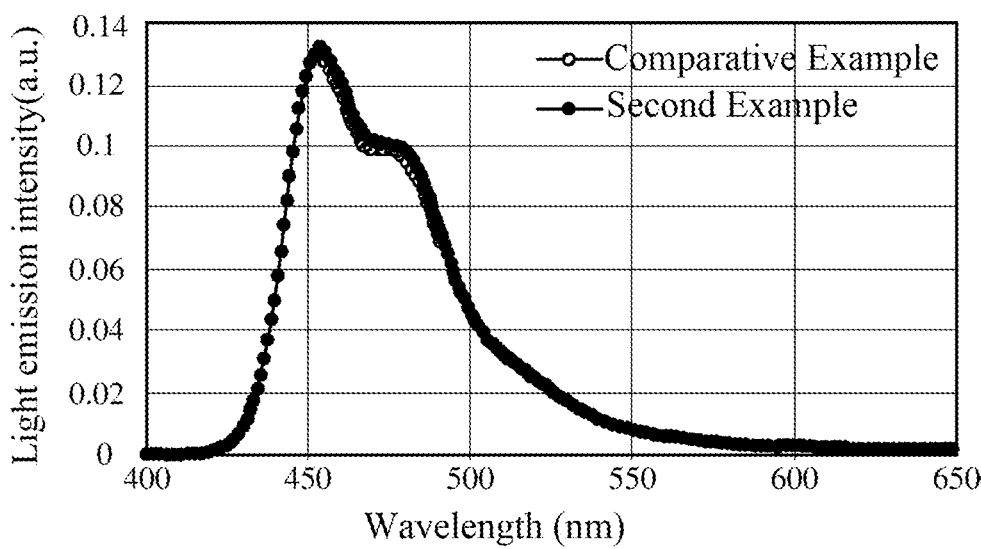
FIG. 13 is a comparative view of spectra in the comparative example and the second example of at least one embodiment of the present disclosure.

FIG. 13 is a comparative view of spectra in the comparative example and the second example. As shown in FIG. 13 a light emission intensity of the OLED device in Example 2 is effectively improved compared to that of the OLED device in the comparative example and a peak position does not change.

In the exemplary embodiment, by adding the hole functional unit between the anode and the hole transport layer, the difficulty of hole injection, due to the work function of anode (for example, the work function of Ti is about 4.3 eV) is unsatisfactory to the requirement (for example, the requirement on the work function of the anode by a silicon-based OLED of a top emission structure is greater than 5 eV), is ameliorated, thereby effectively reducing the operating voltage of the OLED devices, reducing power consumption and expanding a selection range of anode materials. In some examples, the OLED device in the embodiment can be applied to a high-resolution silicon-based microdisplay apparatus, and an ultra-high resolution greater than 3000 Pixels Per Inch (PPI) can be achieved by employing a Ti/Al/Ti anode.

A manufacturing method of an OLED device is also provided in at least one embodiment of the present disclosure, which includes forming an anode, a first light-emitting unit and a cathode on a substrate. The forming the first light-emitting unit includes forming a hole functional unit and a light-emitting layer in turn. The forming the hole functional unit includes: forming a first functional layer for transporting electrons and forming at least one hole functional layer; wherein the hole functional layer at least includes a second functional layer for injecting holes and a third functional layer for transporting holes. The first functional layer includes an electron transport material doped with one or more of an active metal and an active metal compound. An energy level difference between an LUMO level of the second functional layer and an HOMO level of the third functional layer is less than 1 eV.

In some exemplary embodiments, the hole functional layer further includes a fourth functional layer located between the second functional layer and the third functional layer, and the fourth functional layer is a mixed layer including a hole injection material and a hole transport material. An energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

The manufacturing process of the OLED device in the present embodiment will be described below by an example.

In some examples, a manufacturing process of OLED devices includes: successively cleaning a transparent glass substrate forming an anode pattern in an ultrasonic environment of deionized water, acetone and anhydrous ethanol, and then drying with nitrogen (N2) and performing oxygen plasma (O2 plasma) treatment; then, the treated substrate is placed in an evaporation chamber, and a first functional layer, a second functional layer, a third functional layer, a hole transport layer, an electron barrier layer, a light-emitting layer, an electron transport layer, an electron injection layer and a cathode are sequentially deposited on the anode by a vacuum thermal evaporation mode after the vacuum degree is lower than 5×10-4 Pa (Pa).

At least one embodiment of the present disclosure also provides a display substrate including an OLED device as described above.

Figure 14:
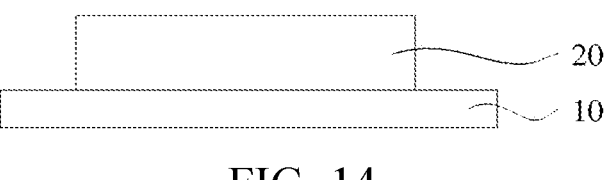
FIG. 14 is a schematic diagram of a display substrate according to at least one embodiment of the present disclosure.

FIG. 14 is a schematic diagram of a display substrate according to at least one embodiment of the present disclosure. As shown in FIG. 14, a display substrate provided in the exemplary embodiment includes a substrate 10, and an OLED device 20 disposed on the substrate 10. The OLED device 20 is an OLED device provided in the foregoing embodiments. In some examples the substrate 10 may be a silicon substrate. The display substrate may be a silicon-based OLED substrate of a top emission structure. However, this embodiment is not limited thereto.

Figure 15:
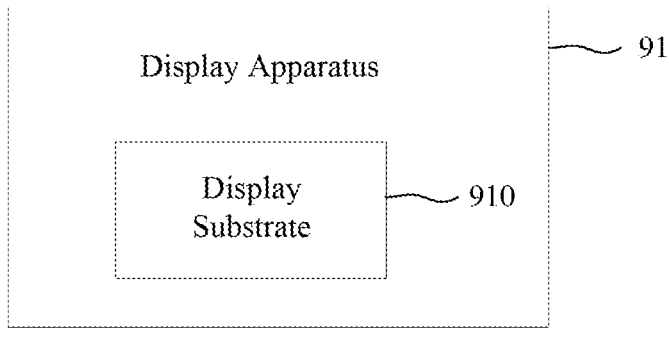
FIG. 15 is a schematic diagram of a display apparatus according to at least one embodiment of the present disclosure.

FIG. 15 is a schematic diagram of a display apparatus according to at least one embodiment of the present disclosure. As shown in FIG. 15, a display apparatus 91 provided in the embodiment includes a display substrate 910. The display substrate 910 is the display substrate provided in the above-mentioned embodiments. In some examples, the display substrate 910 may be an OLED substrate. The display apparatus 91 may be a Augmented Reality (AR) or Virtual Reality (VR) product, a mobile phone, a tablet computer, a television, a display, a notebook computer, a digital photo frame, a navigator, or any other product or component having a display function. However, this embodiment is not limited thereto.

The drawings of the present disclosure only involve the structures involved in the present disclosure, and other structures may refer to conventional designs. The embodiments of the present disclosure and features in the embodiments may be combined mutually to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. An OLED device comprising: an anode, a cathode, and a first light-emitting unit located between the anode and the cathode; wherein the first light-emitting unit comprises a light-emitting layer and a hole functional unit located between the anode and the light-emitting layer;

the hole functional unit at least comprises: a first functional layer for transporting electrons and at least one hole functional layer located between the first functional layer and the light-emitting layer; the first functional layer is in contact with the anode, and any hole functional layer at least comprises a second functional layer for injecting holes and a third functional layer for transporting holes;

the first functional layer comprises an electron transport material doped with one or more of an active metal and an active metal compound;

an energy level difference between a Lowest Unoccupied Molecular Orbital (LUMO) energy level of the second functional layer and a Highest Occupied Molecular Orbital (HOMO) energy level of the third functional layer is less than 1 electron Volt (eV); and a LUMO energy level of the first functional layer ranges from 2.0 eV to 3.0 eV, and a HOMO energy level of the first functional layer ranges from 4.5 eV to 7.0 eV.

2. The OLED device of claim 1, wherein each of thicknesses of the first functional layer, the second functional layer and the third functional layer ranges from 0.1 nm to 100 nm.

3. The OLED device of claim 1, wherein one or more of the active metal and the active metal compound doped in the first functional layer has a doping ratio in the first functional layer ranging from 0.1% to 30%.

4. The OLED device of claim 1, wherein a LUMO energy level of the second functional layer ranges from 4.5 eV to 8.0 eV, and a HOMO energy level of the third functional layer ranges from 4.5 eV to 8.0 eV.

5. The OLED device of claim 1, wherein the hole functional layer further comprises a fourth functional layer located between the second functional layer and the third functional layer, and the fourth functional layer is a mixed layer comprising a hole injection material and a hole transport material; and an energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

6. The OLED device of claim 5, wherein a doping ratio of a hole injection material of the fourth functional layer ranges from 0.1% to 20% in the fourth functional layer.

7. The OLED device of claim 5, wherein the hole injection material of the fourth functional layer is the same as a material of the second functional layer, and the hole transport material of the fourth functional layer is the same as a material of the third functional layer.

8. The OLED device of claim 1, wherein the first functional layer comprises: a first material layer in contact with the anode, a second material layer between the first material layer and the hole functional layer; and the first material layer comprises a metal material, and the second material layer comprises an electron transport material doped with one or more of an active metal and an active metal compound.

9. The OLED device of claim 1, wherein the anode is a reflective anode and the cathode is an optically transparent cathode.

10. The OLED device of claim 1, wherein the first light-emitting unit further comprises at least one of the followings:

a hole transport layer located between the hole functional unit and the light-emitting layer, an electron barrier layer located between the light-emitting layer and the hole transport layer, an electron transport layer located between the light-emitting layer and the cathode, an electron injection layer located between the electron transport layer and the cathode, and a hole barrier layer located between the light-emitting layer and the electron transport layer.

11. The OLED device of claim 1, further comprising: one or more second light emitting units located between the first light-emitting unit and the cathode; wherein adjacent light emitting units are connected by a connection layer;

the first light-emitting unit and the second light emitting unit emit light of different colors; and at least one second light emitting unit comprises a light-emitting layer and at least one of a hole injection layer, a hole transport layer, an electron barrier layer, an electron transport layer, an electron injection layer, and a hole barrier layer.

12. A display substrate, comprising the OLED device of claim 1.

13. A display apparatus, comprising the display substrate of claim 12.

14. A manufacturing method of an OLED device, comprising forming an anode, a first light-emitting unit and a cathode on a substrate; wherein the forming the first light-emitting unit comprises: forming a hole functional unit and a light-emitting layer in turn;

the forming the hole functional unit includes: forming a first functional layer in contact with the anode for transporting electrons and forming at least one hole functional layer; wherein the hole functional layer at least includes a second functional layer for injecting holes and a third functional layer for transporting holes;

the first functional layer comprises an electron transport material doped with one or more of an active metal and an active metal compound; an energy level difference between a Lowest Unoccupied Molecular Orbital (LUMO) energy level of the second functional layer and a Highest Occupied Molecular Orbital (HOMO) energy level of the third functional layer is less than 1 electron Volt (eV); and a LUMO energy level of the first functional layer ranges from 2.0 eV to 3.0 eV, and a HOMO energy level of the first functional layer ranges from 4.5 eV to 7.0 eV.

15. The manufacturing method of claim 14, wherein the hole functional layer further comprises a fourth functional layer located between the second functional layer and the third functional layer, and the fourth functional layer is a mixed layer comprising a hole injection material and a hole transport material;

an energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

16. The OLED device of claim 2, wherein the hole functional layer further comprises a fourth functional layer located between the second functional layer and the third functional layer, and the fourth functional layer is a mixed layer comprising a hole injection material and a hole transport material; and an energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

17. The OLED device of claim 3, wherein the hole functional layer further comprises a fourth functional layer located between the second functional layer and the third functional layer, and the fourth functional layer is a mixed layer comprising a hole injection material and a hole transport material; and an energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

18. The OLED device of claim 4, wherein the hole functional layer further comprises a fourth functional layer located between the second functional layer and the third functional layer, and the fourth functional layer is a mixed layer comprising a hole injection material and a hole transport material; and an energy level difference between an HOMO energy level of the hole transport material of the fourth functional layer and an LUMO energy level of the second functional layer is less than 1 eV, and an energy level difference between an HOMO energy level of the hole transport material of the fourth functional layer and an HOMO energy level of the third functional layer is less than 1 eV.

\* \* \* \* \*